US010504566B2

(12) United States Patent
Hong

(10) Patent No.: US 10,504,566 B2
(45) Date of Patent: Dec. 10, 2019

(54) STORAGE DEVICE AND OPERATING METHOD OF STORAGE DEVICE

(71) Applicant: SAMSUNG ELECTRONICS CO., LTD., Suwon-si, Gyeonggi-Do (KR)

(72) Inventor: Juhyung Hong, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 538 days.

(21) Appl. No.: 14/674,404

(22) Filed: Mar. 31, 2015

(65) Prior Publication Data

US 2016/0027481 A1 Jan. 28, 2016

(30) Foreign Application Priority Data

Jul. 23, 2014 (KR) ........................ 10-2014-0093316

(51) Int. Cl.

| | |
|---|---|
| ***G11C 29/00*** | (2006.01) |
| ***G11C 7/00*** | (2006.01) |
| ***G06F 11/10*** | (2006.01) |
| ***G11C 16/32*** | (2006.01) |
| ***G06F 12/02*** | (2006.01) |
| ***G06F 12/0868*** | (2016.01) |

(Continued)

(52) U.S. Cl.

CPC ............ *G11C 7/00* (2013.01); *G06F 11/1004* (2013.01); *G06F 12/0246* (2013.01); *G06F 12/0868* (2013.01); *G11C 16/32* (2013.01); *G06F 2212/1016* (2013.01); *G06F 2212/7202* (2013.01); *G06F 2212/7203* (2013.01); *G11C 7/22* (2013.01); *G11C 16/10* (2013.01); *G11C 2207/2245* (2013.01); *G11C 2207/2263* (2013.01)

(58) Field of Classification Search

CPC ...... G06F 11/07; G06F 11/10; G06F 11/1004; G06F 12/00; G06F 12/02; G06F 12/08; G06F 3/06; G11C 16/10; G11C 16/32; G11C 2207/2245; G11C 2207/2263; G11C 29/00; G11C 7/00; G11C 7/10; G11C 7/22; H03M 13/05

See application file for complete search history.

(56) References Cited

U.S. PATENT DOCUMENTS 5,754,567 A * 5/1998 Norman .............. G06F 11/1068 365/185.09
RE38,514 E * 5/2004 James ................. G06F 12/0817 711/100

(Continued)

OTHER PUBLICATIONS

Huffman Amber, NVM Express, Oct. 11, 2012, NVMHCI Workgroup Chair: Intel Corporation, revision 1.1, p. 46, 60-61.*
NVM Express, Revision 1.1, Oct. 11, 2012.

*Primary Examiner* — Albert Decady
*Assistant Examiner* — Enamul M Kabir
(74) *Attorney, Agent, or Firm* — Volentine, Whitt & Francos, PLLC

(57) ABSTRACT

The method of operating a storage device includes receiving a command, an address, and data, and comparing data previously stored at a storage space of the nonvolatile memory corresponding to the address with the received data in response to the command. The method includes writing the received data at a nonvolatile memory when the previously stored data is different from the received data. Writing of the received data is terminated when the previously stored data is equal to the received data.

19 Claims, 14 Drawing Sheets

100

120 Memory Controller
128 CWU
110 Nonvolatile Memory
130 RAM
DATA2
CMD2 ADDR2
DATA1
CMD1 ADDR1
CTRL

(51) Int. Cl.
*G11C 7/22* (2006.01)
*G11C 16/10* (2006.01)

(56) References Cited

U.S. PATENT DOCUMENTS 6,789,163 B2 9/2004 Fox et al.
7,853,726 B2 12/2010 Dang et al.
7,900,102 B2 3/2011 Sokolov et al.
8,208,304 B2 6/2012 Shalvi et al.
8,332,590 B1 12/2012 Rohana et al.
8,423,710 B1 4/2013 Gole
8,635,417 B2 1/2014 Morrison et al.
9,229,854 B1 * 1/2016 Kuzmin .............. G06F 12/0246
2002/0030735 A1 * 3/2002 Yamada .................... B60R 1/00 348/47
2005/0021905 A1 * 1/2005 Kwon ................. G06F 11/1032 711/103
2008/0126671 A1 * 5/2008 Kashiwada ......... G06F 12/0246 711/101
2011/0185259 A1 * 7/2011 Seo ..................... G06F 11/1048 714/763
2011/0307646 A1 * 12/2011 Lee ..................... G11C 11/5628 711/103
2012/0005557 A1 * 1/2012 Mardiks .................. G06F 11/10 714/763
2012/0188830 A1 * 7/2012 Jeong ....................... G11C 7/20 365/189.07
2013/0060981 A1 3/2013 Horn et al.
2013/0086311 A1 4/2013 Huang et al.
2013/0198311 A1 8/2013 Tamir et al.
2013/0246839 A1 9/2013 Werner et al.
2013/0297894 A1 * 11/2013 Cohen ................... G06F 3/0679 711/154
2013/0297986 A1 11/2013 Cohen
2013/0326114 A1 * 12/2013 Goss ................... G06F 12/0246 711/103
2014/0040530 A1 2/2014 Chen et al.
2014/0068161 A1 * 3/2014 Yi ....................... G06F 12/0246 711/103
2014/0068374 A1 * 3/2014 Ha .................... H03M 13/2909 714/755
2014/0143635 A1 * 5/2014 Gandhi ............... G06F 11/1064 714/766
2014/0281808 A1 * 9/2014 Lam .................... G06F 11/1048 714/764
2014/0304550 A1 * 10/2014 Miller ................. G06F 11/1435 714/21
2014/0317479 A1 * 10/2014 Candelaria .......... G06F 11/1004 714/807
2014/0325315 A1 * 10/2014 Warnes .................. G11C 29/52 714/767
2015/0074358 A1 * 3/2015 Flinsbaugh ............... G06F 3/06 711/155
2015/0095554 A1 * 4/2015 Asnaashari ......... G06F 12/0246 711/103
2015/0186074 A1 * 7/2015 Benisty ................. G06F 3/0659 711/115

* cited by examiner

STORAGE DEVICE AND OPERATING METHOD OF STORAGE DEVICE

CROSS-REFERENCE TO RELATED APPLICATIONS

A claim for priority under 35 U.S.C. § 119 is made to Korean Patent Application No. 10-2014-0093316 filed Jul. 23, 2014, in the Korean Intellectual Property Office, the entire contents of which are hereby incorporated by reference.

BACKGROUND

The inventive concepts described herein relate to a semiconductor memory, and more particularly, relate to a storage device and an operating method of the storage device.

A semiconductor memory device is a storage device which is fabricated using semiconductors such as, but not limited to, silicon (Si), germanium (Ge), gallium arsenide (GaAs), and indium phosphide (InP). Semiconductor memory devices are classified into volatile memory devices and nonvolatile memory devices.

The volatile memory devices may lose contents stored therein at power-off. The volatile memory devices may include the following: a static RAM (SRAM), a dynamic RAM (DRAM), and a synchronous DRAM (SDRAM), and so on. The nonvolatile memory devices may retain stored contents even at power-off. The nonvolatile memory devices may include the following: a read only memory (ROM), a programmable ROM (PROM), an electrically programmable ROM (EPROM), an electrically erasable and programmable ROM (EEPROM), a flash memory device, a phase-change RAM (PRAM), a magnetic RAM (MRAM), a resistive RAM (RRAM), a ferroelectric RAM (FRAM), and so on.

Nonvolatile memory may be used as storage devices of computing devices including the following: a personal computer, a notebook computer, a smart phone, and smart pad. The storage device is used to store data stably for a long time.

Operating performance of the storage device may be based on various conditions: data write and read speeds of the storage device, communication speed of the storage device with an external device, and operating speed of a computing device accessing the storage device. Nevertheless, there have been made independent researches on the data write and read speeds of the storage device, the communication speed of the storage device, and the operating speed of the computing device. An operating method of the storage device that exhibits optimal operating performance may vary with the data write and read speeds of the storage device, the communication speed of the storage device, and the operating speed of the computing device.

SUMMARY

One aspect of embodiments of the inventive concept is directed to provide an operating method of a storage device which includes a nonvolatile memory and a memory controller adapted to control the nonvolatile memory. The method includes: by the memory controller, receiving a command, an address, and data; comparing, by the memory controller, data previously stored at a storage space of the nonvolatile memory corresponding to the address with the received data in response to the command; and selectively writing the received data based upon the comparison result.

In exemplary embodiments, the comparing, by the memory controller, data previously stored at a storage space of the nonvolatile memory corresponding to the address with the received data in response to the command comprises reading the previously stored data from the nonvolatile memory; and comparing the read data and the received data.

In exemplary embodiments, the comparing, by the memory controller, data previously stored at a storage space of the nonvolatile memory corresponding to the address with the received data in response to the command includes: producing an error check code from the received data; reading an error check code of the previously stored data from the nonvolatile memory; and comparing the read error check code and the produced error check code.

In exemplary embodiments, the comparing, by the memory controller, data previously stored at a storage space of the nonvolatile memory corresponding to the address with the received data in response to the command includes: producing first hash data from the received data; reading the previously stored data from the nonvolatile memory; producing second hash data from the read data; and comparing the first hash data and the second hash data.

In exemplary embodiments, the storage device further comprises a random access memory adapted to operate in response to a control of the memory controller. The comparing, by the memory controller, data previously stored at a storage space of the nonvolatile memory corresponding to the address with the received data in response to the command includes: determining whether the previously stored data is stored in the random access memory; as a consequence of determining that the previously stored data is stored in the random access memory, comparing the data stored in the random access memory and the received data; and as a consequence of determining that the previously stored data is not stored in the random access memory, reading the previously stored data from the nonvolatile memory to compare the read data and the received data.

In exemplary embodiments, the storage device further comprises a random access memory adapted to operate in response to a control of the memory controller. The comparing, by the memory controller, data previously stored at a storage space of the nonvolatile memory corresponding to the address with the received data in response to the command includes: producing a first error check code of the received data; determining whether a second error check code of the previously stored data is stored in the random access memory; as a consequence of determining that the second error check code of the previously stored data is stored in the random access memory, comparing the second error check code stored in the random access memory with the first error check code; and as a consequence of determining that the second error check code of the previously stored data is not stored in the random access memory, reading the second error check code from the nonvolatile memory to compare the second error check code thus read and the first error check code.

In exemplary embodiments, the storage device further comprises a random access memory adapted to operate in response to a control of the memory controller. The comparing, by the memory controller, data previously stored at a storage space of the nonvolatile memory corresponding to the address with the received data in response to the command includes: producing first hash data of the received data; determining whether second hash data of the previously stored data is stored in the random access memory; as a consequence of determining that the second hash data of the previously stored data is stored in the random access memory, comparing the second hash data of the random access memory and the first hash data; and as a consequence of determining that the second hash data of the previously stored data is not stored in the random access memory, reading the previously stored data from the nonvolatile memory, producing the second hash data from the previously stored data, and comparing the first hash data and the second hash data thus generated.

In exemplary embodiments, the command includes an operation code indicating a compare request, a code indicating a first command of a fused operation, and a flag code indicating a specific operation.

In exemplary embodiments, the operating method further comprises receiving a second command. The second command includes an operation code indicating a write request, a code indicating a second command of the fused operation, and the flag code indicating a specific operation. Selectively writing the received data according to the comparison result is performed in response to the second command.

In exemplary embodiments, the operating method further comprises outputting a first response when the previously stored data is different from the received data, and the second command is received after the first response is output.

In exemplary embodiments, the first command and the second command are continuously received regardless of operating steps of the storage device.

In exemplary embodiments, the first command and the second command have a format for the specification of NVMe (NonVolatile Memory express).

Another aspect of embodiments of the inventive concept is directed to providing a storage device comprising a nonvolatile memory; and a memory controller adapted to control the nonvolatile memory, wherein the memory controller is further adapted to determine whether data received together with an address from an external device is equal to data previously stored at a storage space of the nonvolatile memory corresponding to the address and to selectively write the received data at the nonvolatile memory according to the determination result.

In exemplary embodiments, the memory controller comprises an ECC (error correction code) block adapted to produce an error correction code from the received data, and the memory controller is further adapted to compare the error correction code of the received data and an error correction code of the previously stored data and to determine whether the received data is equal to the previously stored data, according to the comparison result.

In exemplary embodiments, the memory controller comprises a hash generator adapted to produce a hash from the received data or the previously stored data, and the memory controller is further adapted to compare the hash of the received data and a hash of the previously stored data and to determine whether the received data is equal to the previously stored data, according to the comparison result.

In exemplary embodiments, the nonvolatile memory includes a plurality of cell strings arranged on a substrate along rows and columns, and each cell string includes at least one ground selection transistor, a plurality of memory cells, and at least one string selection transistor sequentially stacked on the substrate in a direction perpendicular to the substrate.

In exemplary embodiments, the storage device communicates with the external device according to the specification of NVMe (NonVolatile Memory express).

In exemplary embodiments, the storage device further comprises a random access memory adapted to operate as a buffer memory between the nonvolatile memory and the external device according to a control of the memory controller, and the nonvolatile memory, the random access memory, and the memory controller constitute a solid state drive.

Still another aspect of embodiments of the inventive concept is directed to providing a method of writing data at a storage device, comprising determining whether data to be written is overwrite data; as a consequence of determining that the data to be written is not the overwrite data, transmitting the data to be written, an address, and a write command to the storage device; and as a consequence of determining that the data to be written is the overwrite data, transmitting the data to be written, the address, and a compare command for a fused operation to the storage device.

In exemplary embodiments, the method further comprises terminating writing of the data to be written, when the storage device issues a response indicating sameness according to the compare command; and issuing a write command of the fused operation to the storage device, when the storage device issues a response indicating differentness according to the compare command.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
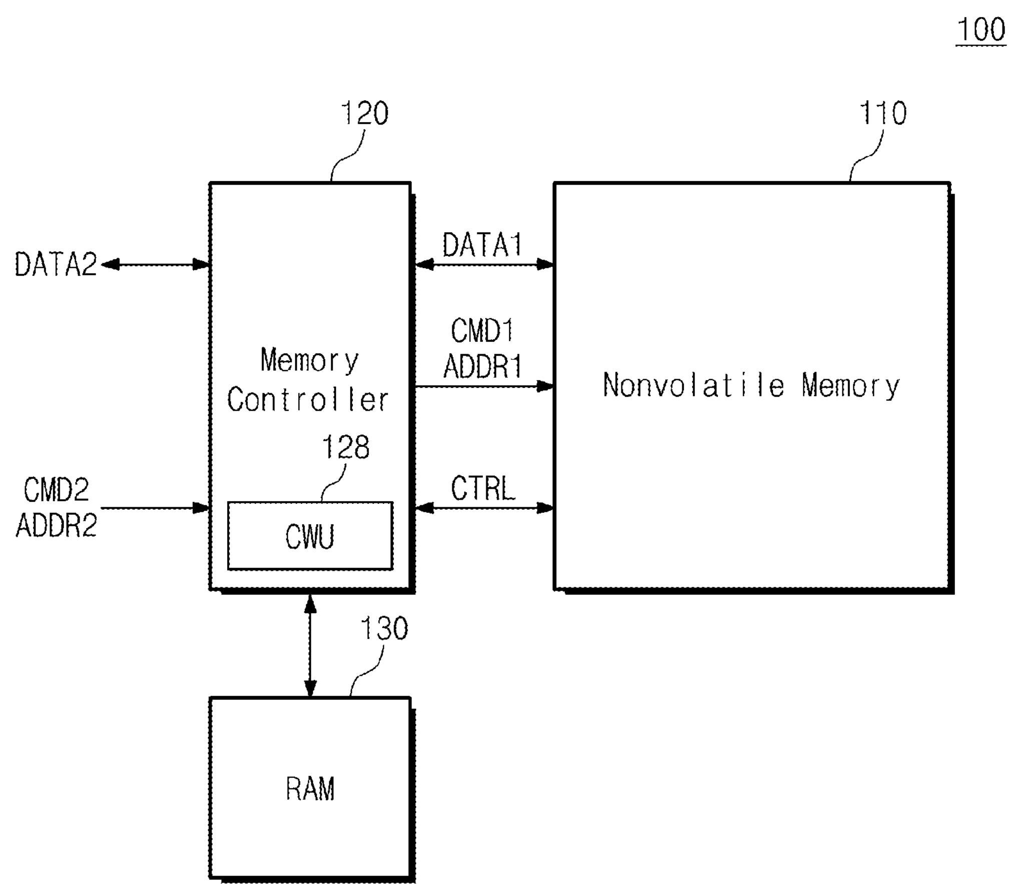
FIG. 1 is a block diagram schematically illustrating a storage device according to an embodiment of the inventive concept.

Embodiments will be described in detail with reference to the accompanying drawings. The inventive concept, however, may be embodied in various different forms, and should not be construed as being limited only to the illustrated embodiments. Rather, these embodiments are provided as examples so that this disclosure will be thorough and complete, and will fully convey the concept of the inventive concept to those skilled in the art. Accordingly, known processes, elements, and techniques are not described with respect to some of the embodiments of the inventive concept. Unless otherwise noted, like reference numerals denote like elements throughout the attached drawings and written description, and thus descriptions will not be repeated. In the drawings, the sizes and relative sizes of layers and regions may be exaggerated for clarity.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it may be the only layer between the two layers, or one or more intervening layers may also be present.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "exemplary" is intended to refer to an example or illustration.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

FIG. 1 is a block diagram schematically illustrating a storage device 100 according to an embodiment of the inventive concept. Referring to FIG. 1, a storage device 100 contains a nonvolatile memory 110, a memory controller 120, and a RAM 130.

The nonvolatile memory 110 performs read, write, and erase operations according to a control of the memory controller 120. The nonvolatile memory 110 exchanges first data DATA1 with the memory controller 120. For example, the nonvolatile memory 110 receives the first data DATA1 from the memory controller 120 and stores the first data DATA1. The nonvolatile memory 110 performs a read operation and outputs the read data to the memory controller 120.

The nonvolatile memory 110 receives a first command CMD1 and a first address ADDR1 from the memory controller 120. The nonvolatile memory 110 exchanges a control signal CTRL with the memory controller 120. For example, the nonvolatile memory 110 receives, from the memory controller 120, at least one of a chip enable signal /CE for selecting at least one of a plurality of semiconductor devices constituting the nonvolatile memory 110, a command latch enable signal CLE indicating that a signal received from the memory controller 120 is the first command CMD1, an address latch enable signal ALE indicating that a signal received from the memory controller 120 is the first address ADDR1, a read enable signal /RE received from the memory controller 120 at a read operation, periodically toggled, and used to tune timing, a write enable signal /WE activated by the memory controller 120 when the first command CMD1 or the first address ADDR1 is transmitted, a write protection signal /WP activated by the memory controller 120 to prevent unintended writing or erasing when a power changes, and a data strobe signal DQS used to adjust input synchronization about the first data DATA1 and generated from the memory controller 120 at a write operation so as to be periodically toggled. For example, the nonvolatile memory 110 outputs, to the memory controller 120, at least one of a ready/busy signal R/nB indicating whether the nonvolatile memory 110 is performing a program, erase or read operation and a data strobe signal DQS used to adjust output synchronization about the first data DATA1 and generated from the read enable signal /RE by the nonvolatile memory 110 so as to be periodically toggled.

The nonvolatile memory 110 may include a flash memory. However, the inventive concept is not limited thereto. For example, the nonvolatile memory 110 may incorporate at least one of nonvolatile memories, such as PRAM (Phase-change RAM), MRAM (Magnetic RAM), RRAM (Resistive RAM), and FeRAM (Ferroelectric RAM).

The memory controller 120 is configured to control the nonvolatile memory 110. For example, the nonvolatile memory 110 performs a write, read, or erase operation according to a control of the memory controller 120. The memory controller 120 exchanges the first data DATA1 and the control signal CTRL with the nonvolatile memory 110 and outputs the first command CMD1 and the first address ADDR1 to the nonvolatile memory 110.

The memory controller 120 controls the nonvolatile memory 110 according to a control of an external host device (not shown). The memory controller 120 exchanges second data DATA2 with the host device and receives a second command CMD2 and a second address ADDR2 therefrom. In exemplary embodiments, the memory controller 120 exchanges the first data DATA1 with the nonvolatile memory 110 by a first time unit; moreover, it exchanges the second data DATA2 with the host device by a second time unit different from the first time unit.

Based on a first format, the memory controller 120 exchanges the first data DATA1 with the nonvolatile memory 110 and transmits the first command CMD1 and the first address ADDR1 to the nonvolatile memory 110. Based on a second format different from the first format, the memory controller 120 exchanges the second data DATA2 with the host device and receives the second command CMD2 and the second address ADDR2 from the host device.

The memory controller 120 uses the RAM 130 as a working memory, a buffer memory, or a cache memory. For example, the memory controller 120 receives the second data DATA2 from the host device and stores the second data DATA2 in the RAM 130. The memory controller 120 writes the second data DATA2 stored in the RAM 130 at the nonvolatile memory 110 as the first data DATA1. The memory controller 120 reads the first data DATA1 from the nonvolatile memory 110 and stores the first data DATA1 thus read in the RAM 130. The memory controller 120 outputs the first data DATA1 stored in the RAM 130 to the host device as the second data DATA2. The memory controller 120 stores data read from the nonvolatile memory 110 at the RAM 130 and writes the data stored in the RAM 130 back at the nonvolatile memory 110.

The memory controller 120 stores data or codes, needed to manage the nonvolatile memory 110, at the RAM 130. For example, the memory controller 120 reads data or codes, needed to manage the nonvolatile memory 110, from the nonvolatile memory 110 and loads the read data or codes on the RAM 130 for driving.

The memory controller 120 contains a compare and write unit 128. The compare and write unit 128 may receive the second command CMD2, the second address ADDR2 and the second data DATA2 from the external host device. The compare and write unit 128 performs comparing and writing in response to the second command CMD2 received from the external host device. The compare and write unit 128 compares data, which is previously stored at the nonvolatile memory 110 and corresponds to the second address ADDR2, with the second data DATA2 received from the external host device. Based on the comparison result, the compare and write unit 128 performs or aborts writing of the second data DATA2 at the nonvolatile memory 110.

The RAM 130 may include at least one of a variety of random access memories, such as, but not limited to, a static RAM, a dynamic RAM, a synchronous DRAM (SRAM), a Phase-change RAM (PRAM), a Magnetic RAM (MRAM), a Resistive RAM (RRAM), and a Ferroelectric RAM (FRAM).

The storage device 100 performs an operation of writing, reading or erasing data according to a request of the host device. The storage device 100 may include a solid state drive (SSD) or a hard disk drive (HDD). The storage device 100 may include memory cards, such as PC card (PCMCIA, personal computer memory card international association), compact flash card, smart media card (SM, SMC), memory stick, multimedia card (MMC, RS-MMC, MMCmicro), SD card (SD, miniSD, microSD, SDHC), USB (Universal Serial Bus) memory card, and universal flash storage (UFS). The storage device 100 may include embedded memories, such as eMMC (embedded MultiMedia Card), UFS, and PPN (Perfect Page New).

Read and write characteristics of the nonvolatile memory 110 are different from those of the RAM 130. For example, the RAM 130 reads and writes data randomly and overwrites first data on a memory cell at which second data was previously stored; however, the nonvolatile memory 110 does not support overwriting. To store first data on a memory cell at which second data was stored, the nonvolatile memory 110 erases the memory cell at which the second data was previously stored and writes the first data at the erased memory cell. That is, the nonvolatile memory 110 is a kind of erase-before-write memory.

The storage device 100 performs address mapping to reduce overhead causing an erase operation of the nonvolatile memory 110. When an overwrite operation is requested by the external host device, the storage device 100 stores overwrite-requested data at memory cells of a free storage space, instead of operations of erasing memory cells at which previous data was stored and storing overwrite-requested data at the erased memory cells. The memory controller 120 runs FTL (Flash Translation Layer) that performs address mapping between a logical address, used in the external host device, and a physical address, used in the nonvolatile memory 110, according to the above-described way. For example, the second address ADDR2 is a logical address, and the first address ADDR1 is a physical address.

Figure 2:
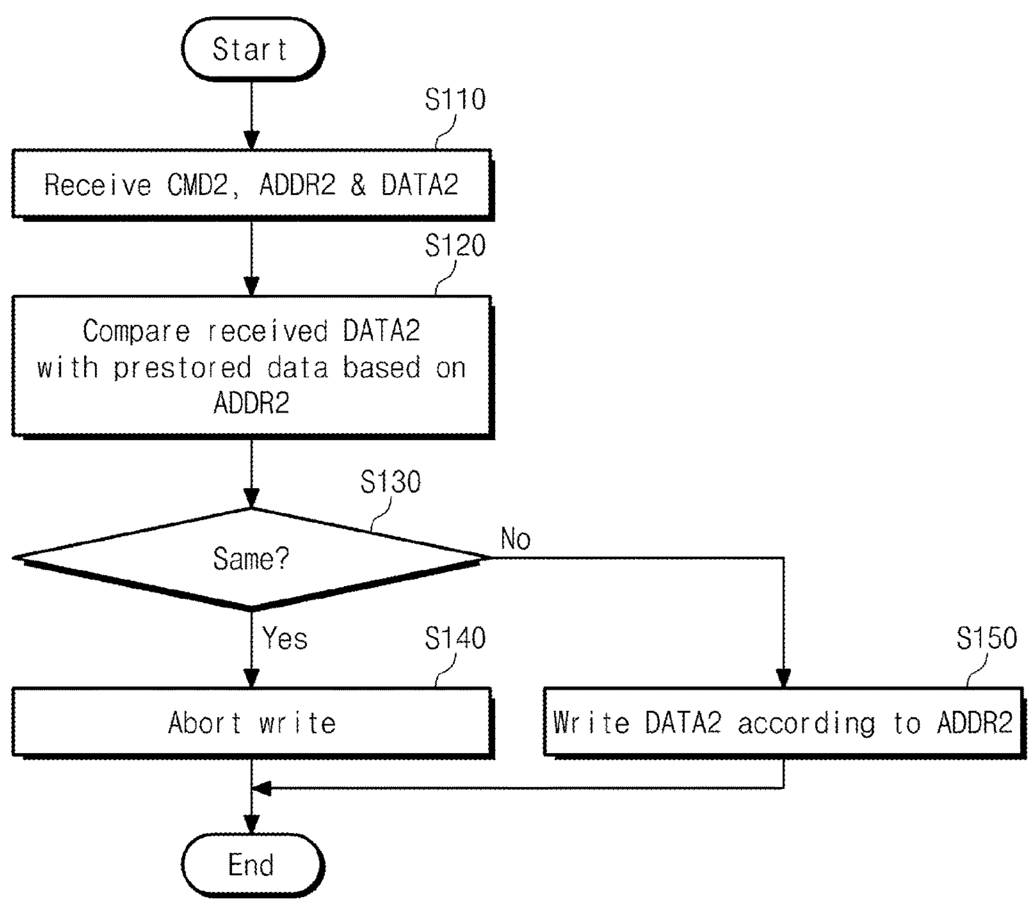
FIG. 2 is a flow chart showing an operating method of a storage device, according to an embodiment of the inventive concept.

FIG. 2 is a flow chart showing an operating method of a storage device 100, according to an embodiment of the inventive concept. Shown in FIG. 2 is an embodiment where a storage device 100 carries out a compare and write operation in response to a second command CMD2. Referring to FIGS. 1 and 2, in step S110, a memory controller 120 receives a second command CMD2, a second address ADDR2, and second data DATA2. The second command CMD2 may be a command causing the compare and write operation. The second data DATA2 is stored at a RAM 130, and the second command CMD2 and the second address ADDR2 are stored at an internal memory of the memory controller 120.

In step S120, the memory controller 120, in particular, a compare and write unit 128 compares the second data DATA2 with previously stored data, based on the second address ADDR2. For example, the compare and write unit 128 compares the second data DATA2 with data that is previously stored at a storage space of the nonvolatile memory 110 corresponding to the second address ADDR2.

In step S130, the memory controller 120, in particular, the compare and write unit 128 determines whether the second data DATA2 is equal to the previously stored data. A write operation of the second data DATA2 is terminated when the second data DATA2 is equal to the previously stored data in step S140. If the second data DATA2 is different from the previously stored data, the method proceeds to step S150, in which the second data DATA2 is written at the nonvolatile memory 110 according to the second address ADDR2.

For example, the second data DATA2 is stored at the RAM 130 and is registered (or scheduled) as data to be written at the nonvolatile memory 110. The memory controller 120 may write the second data DATA2 stored at the RAM 130 at the nonvolatile memory 110 according to a write schedule.

For example, the second data DATA2 is stored at a storage space of the nonvolatile memory 110 corresponding to the second address ADDR2. If previously stored data exist at a space of the nonvolatile memory 110 corresponding to the second address ADDR2, the previously stored data may be invalidated. Meanwhile, a part of a free storage space of the nonvolatile memory 110 may be assigned to a storage space corresponding to the second address ADDR2. In this case, the second data DATA2 may be stored at the free storage space thus assigned.

Figure 3:
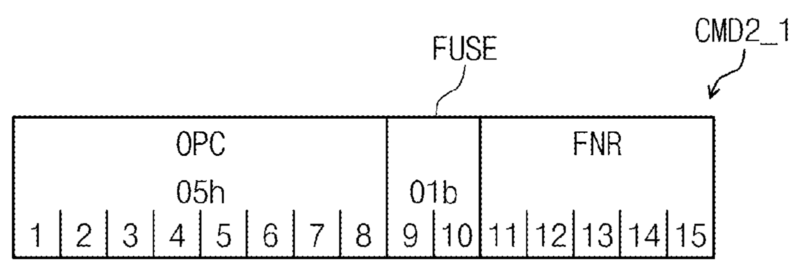
FIG. 3 is a diagram schematically illustrating a format of a second command causing a compare and write operation.
Figure 3:
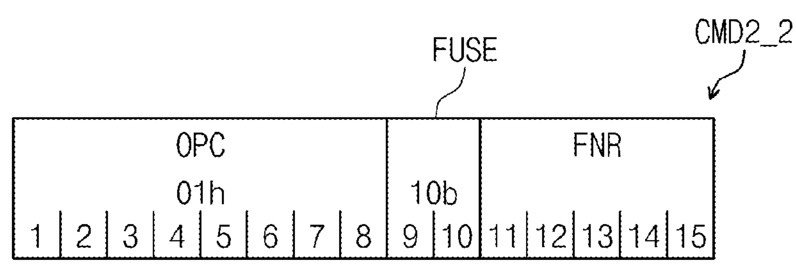

FIG. 3 is a diagram schematically illustrating a format of a second command CMD2 causing a compare and write operation. Referring to FIGS. 1 through 3, the second command CMD2 has a format for the specification of NVMe (NonVolatile Memory express).

At a compare and write operation, a storage device 100 receives two second commands CMD2_1 and CMD2_2. The second command CMD2_1 may cause comparison of step S120. The second command CMD2_1 is received together with second data DATA2 and a second address ADDR2. The second command CMD2_2 may cause writing of step S140 or S150. The second command CMD2_2 is received alone or together with at least one of the second data DATA2 and the second address ADDR2. The second data DATA2 received together with the second command CMD2_2 is the same as the second data DATA2 received together with the second command CMD2_1. The second address ADDR2 received together with the second command CMD2_2 is the same as the second address ADDR2 received together with the second command CMD2_1. That is, the second data DATA2 or the second address ADDR2 may be received twice with the second commands CMD2_1 and CMD2_2.

The second commands CMD2_1 and CMD2_2 include information on a fused operation that is defined by the specification of the NVMe. To guarantee that the fused operation is an atomic operation, the size of the second data DATA2 received together with the second command CMD2_1 may be equal to or smaller than that of an atomic write unit or an atomic transmission unit of a storage device 100 and an external host device communicating with the storage device 100. The atomic write unit may be a unit of data which the external host device writes at the storage device 100 at a time, for example, through one transaction. The atomic transmission unit may be a unit of data which the external host device transmits data to the storage device 100 at a time, for example, through one transaction. That is, if the size of the second data DATA2 to be written into the storage device 100 is bigger than the atomic transmission unit, the compare and write operation may not be allowed.

The second command CMD2_1 contains an operation code OPC, a fused operation code FUSE, and a flag and reserved code FNR. The operation code OPC is formed of first through eighth bits of the second command CMD2_1. The operation code OPC includes information on a type of the second command CMD2_1. For example, the operation code OPC of the second command CMD2_1 may be '05h'. The operation code OPC of '05h' means "compare".

The fused operation code FUSE is formed of ninth and tenth bits of the second command CMD2_1. The fused operation code FUSE includes information on whether the second command CMD2_1 corresponds to a part of a fused operation. For example, the fused operation code FUSE of the second command CMD2_1 is '01b'. The fused operation code FUSE of '01b' indicates that the second command CMD2_1 corresponds to a preceding command of the fused operation.

The flag and reserved code FNR is formed of eleventh through fifteen bits of the second command CMD2_1. At least one bit of the flag and reserved code FNR is used as a flag code. When the flag code has a first value, the second command CMD2_1 may be interpreted as a fused operation according to the specification of the NVMe. When the flag code has a second value, the second command CMD2_1 may be interpreted as a fused operation (a compare and write operation described with reference to FIG. 2) according to an embodiment of the inventive concept. That is, the flag code of the second command CMD2_1 may have the second value in an embodiment according to the inventive concept.

An operation code OPC of the second command CMD2_2 is '01h'. The operation code of '01h' means "write". A fused operation code FUSE of the second command CMD2_2 is 10b'. The fused operation code FUSE of 10b' indicates that the second command CMD2_2 corresponds to a succeeding command of the fused operation. A flag code of the second command CMD2_2 may have a second value in an embodiment according to the inventive concept.

In FIG. 3, an embodiment of the inventive concept is exemplified as whether the second command CMD2 corresponds to a fused operation according to an embodiment of the inventive concept is decided according to the flag and reserved code FNR. However, the inventive concept is not limited thereto. For example, included in the operation code OPC is information on whether the second command CMD2 corresponds to a fused operation according to an embodiment of the inventive concept. Alternatively, an operation code OPC indicating a fused operation according to an embodiment of the inventive concept may be newly defined.

In exemplary embodiments, a storage device 100 may perform comparison of step S120 of FIG. 2 in response to the second command CMD2_1. A comparison result may be sent to an external host device. After the comparison result is sent to the external host device, the storage device may receive the second command CMD2_2. The storage device 100 may perform writing of step S140 or S150 of FIG. 2 in response to the second command CMD2_2.

In exemplary embodiments, when the comparison result indicates sameness, the second command CMD2_2 may not be provided to the storage device 100. The storage device 100 may perform step S140 without the second command CMD2_2. When the comparison result indicates differentness, the second command CMD2_2 may be provided to the storage device 100. The storage device 100 may perform step S150 in response to the second command CMD2_2.

In exemplary embodiments, the second commands CMD2_1 and CMD2_2 may be provided to the storage device 100 regardless of operating steps of the storage device 100. For example, the second commands CMD2_1 and CMD2_2 may be continuously provided to the storage device 100. The storage device 100 may perform comparison (S120) in response to the second command CMD2_2 of the second commands CMD2_1 and CMD2_2. The storage device 100 may perform step S150 (writing) or step S140 (aborting), based on the second command CMD2_2 and the comparison result.

Figure 4:
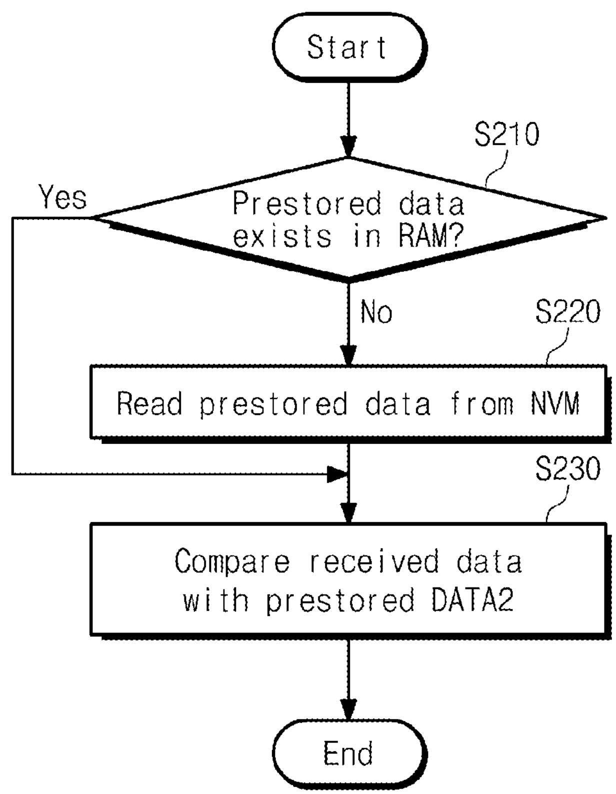
FIG. 4 is a flow chart showing a method where a storage device compares second data with previously stored data, according to an embodiment of the inventive concept.

FIG. 4 is a flow chart showing a method where a storage device 100 compares second data DATA2 with previously stored data, according to an embodiment of the inventive concept. Referring to FIGS. 1 and 4, in step S210, a memory controller 120 determines whether previously stored data exists in a RAM 130.

For example, the RAM 130 may act as a buffer memory or a cache memory. Data to be written into a nonvolatile memory 110 may be written into the RAM 130 first. The data stored in the RAM 130 is written at the nonvolatile memory 110. After the data is written in the nonvolatile memory 110, the data is retained in the RAM 130 during a predetermined time. For example, the data is retained in the RAM 130 until a predetermined amount of data is newly stored at the RAM 130 after writing of the data at the nonvolatile memory 110 or until a free storage capacity of the RAM 130 becomes smaller than a reference value.

Data read from the nonvolatile memory 110 is stored at the RAM 130 first. The data stored at the RAM 130 is sent to the external host device. Afterwards, the data is retained in the RAM 130 during a predetermined time. For example, the data is retained in the RAM 130 until a predetermined amount of data is newly stored at the RAM 130 after reading of the data from the nonvolatile memory 110 or until a free storage capacity of the RAM 130 becomes smaller than the reference value.

The memory controller 120 determines whether data corresponding to a second address ADDR2 received is retained in the RAM 130.

Returning to step S210, if previously stored data exists in the RAM 130, the method proceeds to step S230. If previously stored data does not exist in the RAM 130, in step S220, it is read out from the nonvolatile memory 110. For example, the memory controller 120 reads data corresponding to the second address ADDR2 from the nonvolatile memory 110. The read data is stored in the RAM 130. Afterwards, the method proceeds to step S230. In step S230, the comparison is made between the second data DATA2 received and the previously stored data.

Figure 5:
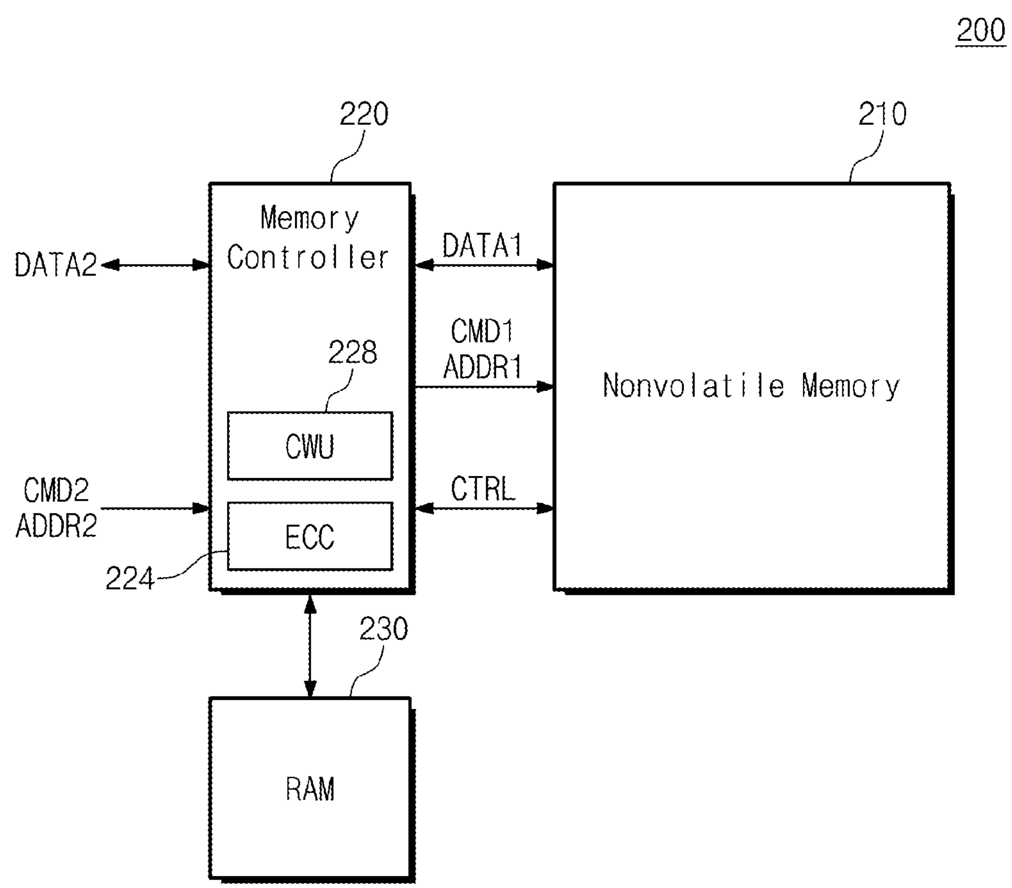
FIG. 5 is a block diagram schematically illustrating a storage device according to another embodiment of the inventive concept.

FIG. 5 is a block diagram schematically illustrating a storage device 200 according to another embodiment of the inventive concept. Referring to FIG. 5, a storage device 200 contains a nonvolatile memory 210, a memory controller 220, and a RAM 230. The memory controller 220 includes a compare and write unit 228 and an ECC (error correction code) block 224.

The memory controller 220 of the storage device 200 further comprises the ECC block 224 in comparison with that of a storage device 100 shown in FIG. 1. The ECC block 224 produces an error correction code from first data DATA1 to be written at the nonvolatile memory 210 or from second data DATA2 received from an external host device. The error correction code thus produced is written at the nonvolatile memory 210 together with the first data DATA1. At a read operation, the first data DATA1 is read out together with an error correction code associated with the first data DATA1. The ECC block 224 corrects an error of the first data DATA1 using the error correction code read together with the first data DATA1.

Figure 6:
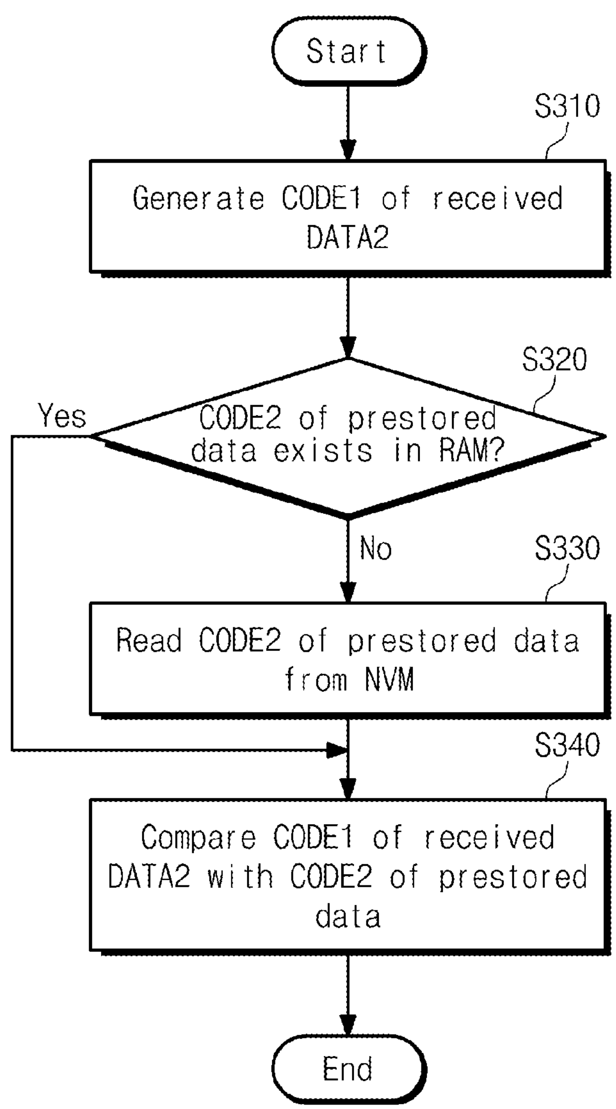
FIG. 6 is a flow chart showing an operating method of a storage device according to another embodiment of the inventive concept.

FIG. 6 is a flow chart showing an operating method of a storage device 200 according to another embodiment of the inventive concept. Shown in FIG. 6 is a method where a storage device 200 compares second data DATA2 received and previously stored data.

Referring to FIGS. 5 and 6, in step S310, a memory controller 220 produces a first error correction code CODE1, based on the second data DATA2 received from an external host device or based on first data DATA1 to be written into a nonvolatile memory 210. In step S320, the memory controller 220 determines whether a second error correction code CODE2 of the previously stored data exists in a RAM 230.

As described with reference to FIG. 4, the RAM 230 is used as a buffer memory or a cache memory, for example. Data written at a nonvolatile memory 210 or data read from the nonvolatile memory 210 is retained in the RAM 230 during a predetermined time. Likewise, an error correction code of the data written at a nonvolatile memory 210 or the data read from the nonvolatile memory 210 is retained in the RAM 230 during the predetermined time.

If the second error correction code CODE2 of the previously stored data exists in the RAM 230, the method proceeds to step S340. If the second error correction code CODE2 of the previously stored data does not exist in the RAM 230, the method proceeds to step S330. In step S330, the memory controller 220 reads the second error correction code CODE2 of the previously stored data from the nonvolatile memory 210. For example, the memory controller 220 reads the second error correction code CODE2 from a storage space of the nonvolatile memory 210 corresponding to a second address ADDR2 received. The memory controller 220 reads the second error correction code CODE2 and the previously stored data from a storage space of the nonvolatile memory 210 corresponding to the second address ADDR2 received. The second error correction code CODE2 or the second data DATA2 read from the nonvolatile memory 210 is stored in the RAM 230. Afterwards, the method proceeds to step S340.

In step S340, the memory controller 220 compares a first error correction code CODE1 of the second data DATA2 received and the second error correction code CODE2 of the previously stored data.

Figure 7:
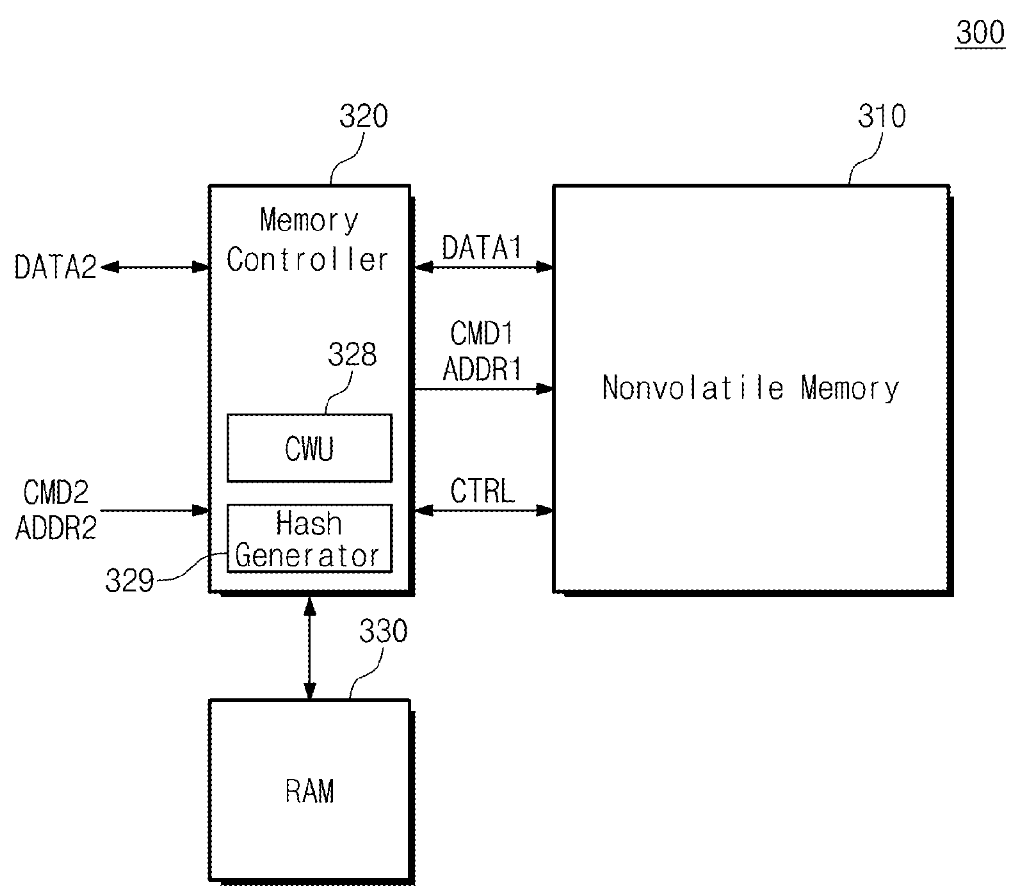
FIG. 7 is a block diagram schematically illustrating a storage device according to still another embodiment of the inventive concept.

FIG. 7 is a block diagram schematically illustrating a storage device 300 according to still another embodiment of the inventive concept. Referring to FIG. 7, a storage device 300 contains a nonvolatile memory 310, a memory controller 320, and a RAM 330. The memory controller 320 includes a compare and write unit 328 and a hash generator 329. The storage device 300 further comprises the hash generator 329 in comparison with a storage device 100 shown in FIG. 1.

The hash generator 329 produces a hash from first data DATA1 to be written at the nonvolatile memory 210 or from second data DATA2 received from an external host device. The hash generator 329 also produces a hash from first data DATA1 read from the nonvolatile memory 210. The hash generator 329 may generate a full hash or a partial hash.

Figure 8:
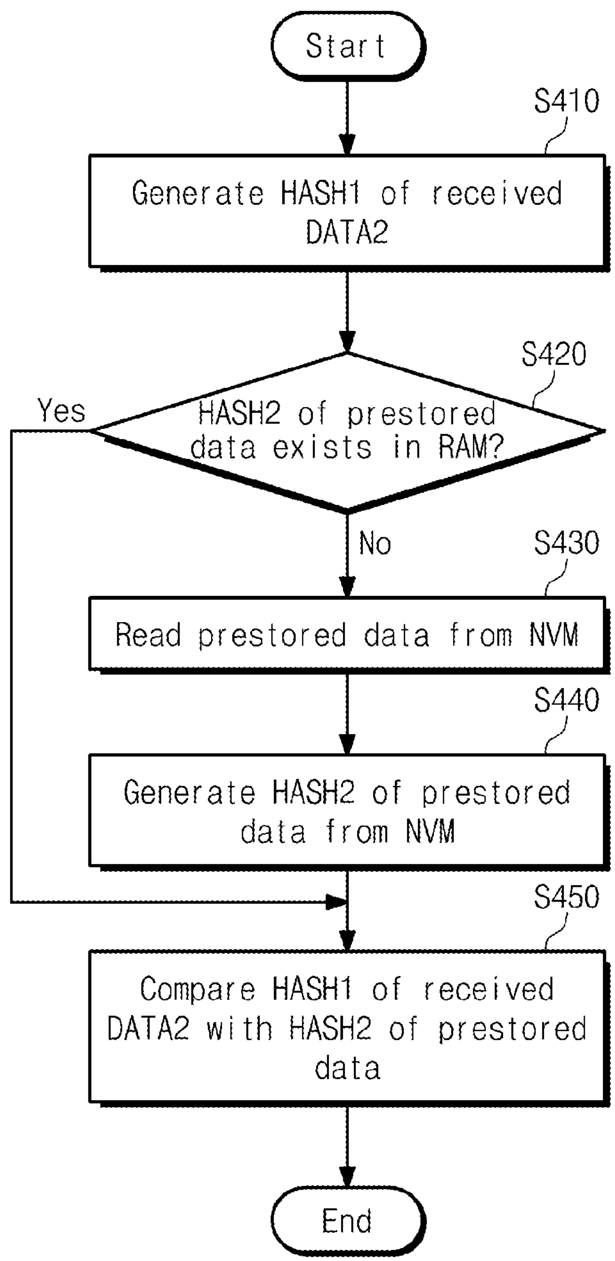
FIG. 8 is a flow chart showing an operating method of a storage device according to still another embodiment of the inventive concept.

FIG. 8 is a flow chart showing an operating method of a storage device 300 according to still another embodiment of the inventive concept. Referring to FIGS. 7 and 8, in step S410, a memory controller 320 generates a first hash HASH1 from second data DATA2 received or from first data DATA1 to be written.

In step S420, the memory controller 320 determines whether a second hash HASH2 of previously stored data exists in a RAM 320. As described with reference to FIG. 4, the RAM 330 is used as a buffer memory or a cache memory, for example. A hash that a hash generator 329 produces is retained in the RAM 330 during a predetermined time. If the second hash HASH2 of the previously stored data exists in the RAM 330, the method may proceed to step S450. If the second hash HASH2 of the previously stored data does not exist in the RAM 330, the method may proceed to step S430.

In step S430, the memory controller 330 reads the previously stored data from a nonvolatile memory 310. For example, the memory controller 330 reads the previously stored data from a storage space of the nonvolatile memory 310 corresponding to a second address ADDR2 received. The previously stored data read from the nonvolatile memory 310 is stored in the RAM 330 or is directly transferred to the hash generator 329.

In step S440, the hash generator 329 generates the second hash HASH2 from the previously stored data read from the nonvolatile memory 310. The second hash HASH2 thus generated is stored in the RAM 330.

In step S450, the memory controller 320 compares the first hash HASH1 of the second data DATA2 received and the second hash HASH2 of the previously stored data.

In exemplary embodiments, it is possible to combine at least two of the approaches described with reference to FIG. 4, to FIG. 6, and to FIG. 8. For example, at least two of a first method in which second data DATA2 received (or first data DATA1 to be written) is compared with previously stored data, a second method in which a first error correction code of the second data DATA2 (or first data DATA1 to be written) is compared with a second error correction code of the previously stored data, and a third method in which a first hash HASH1 of the second data DATA2 (or first data DATA1 to be written) is compared with a second hash HASH2 of the previously stored data may be carried out one by one. That each comparison result indicating sameness means that the second data DATA2 and the previously stored data are the same.

Figure 9:
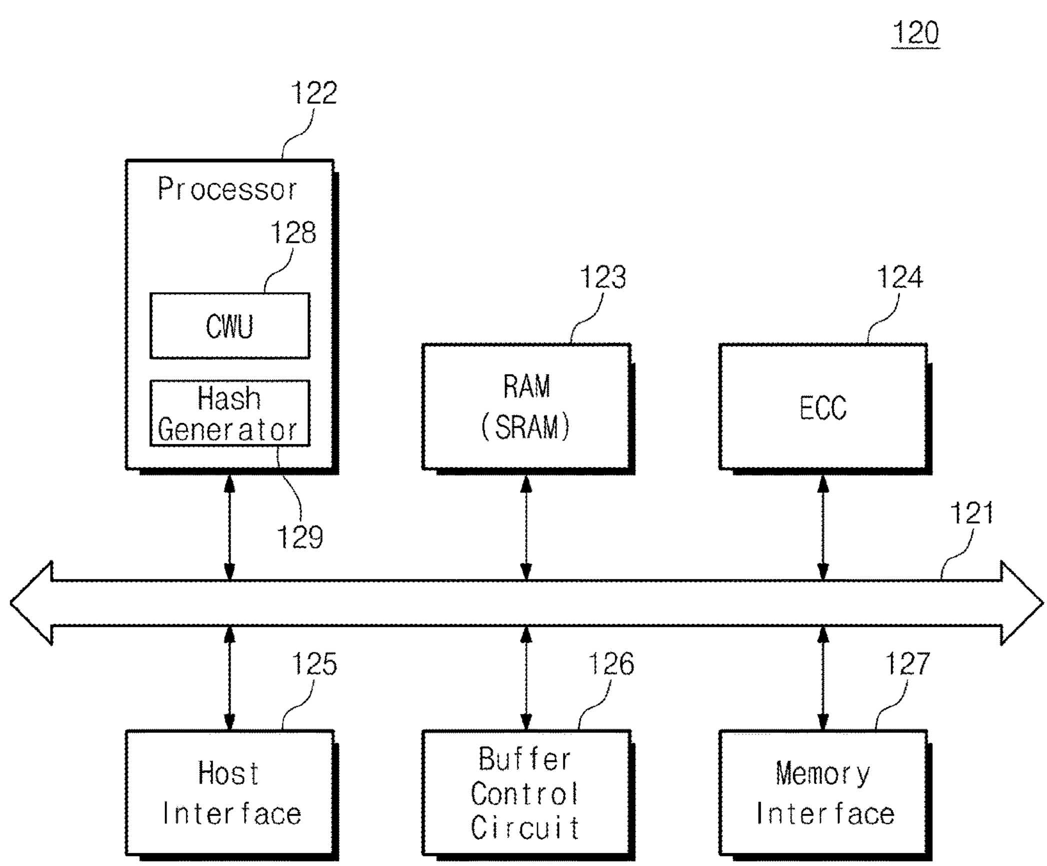
FIG. 9 is a block diagram schematically illustrating a memory controller according to an embodiment of the inventive concept.

FIG. 9 is a block diagram schematically illustrating a memory controller 120 according to an embodiment of the inventive concept. Referring to FIG. 9, a memory controller 120 contains a bus 121, a processor 122, a RAM 123, an ECC block 124, a host interface 125, a buffer control circuit 126, and a memory interface 127. The bus 121 may be configured to provide a channel among components of the memory controller 120.

The processor 122 controls an overall operation of the memory controller 120 and executes a logical operation. The processor 122 communicates with an external host device (refer to FIG. 1) through the host interface 125. The processor 122 stores, in the RAM 123, a second command CMD2 or a second address ADDR2 received through the host interface 125. The processor 122 produces a first command CMD1 and a first address ADDR1 according to the second command CMD2 or the second address ADDR2 stored in the RAM 123. The processor 122 outputs the first command CMD1 and the first address ADDR1 through the memory interface 127.

The processor 122 outputs the second data DATA2 received from the host interface 125 through the buffer control circuit 126 or stores it in the RAM 123. The processor 122 outputs, through the memory interface 127, data stored in the RAM 123 or data received through the buffer control circuit 126. The processor 122 stores the first data DATA1 received through the memory interface 127 in the RAM 123 or outputs it through the buffer control circuit 126. Under a control of the processor 122, data stored in the RAM 123 or data received through the buffer control circuit 126 is output through the host interface 125 as the second data DATA2 or is output through the memory interface 127 as the first data DATA1.

The processor 122 includes a compare and write unit 128 and a hash generator 129. The compare and write unit 128 performs a compare and write operation described with reference to FIG. 2 when received are second commands CMD2_1 and CMD2_2 described with reference to FIG. 3. The hash generator 129 is configured to generate a hash from the second data DATA2 received through the host interface 125, the first data DATA1 received from the memory interface 127, or data received from the buffer control circuit 126. In FIG. 9, an embodiment of the inventive concept is exemplified as the hash generator 129 is a component of the processor 122. However, the inventive concept is not limited thereto. For example, the hash generator 129 may be implemented as a component that is separated from the processor 122 and coupled with the bus 121.

The RAM 123 is used as a working memory, a cache memory, or a buffer memory of the processor 122. The RAM 123 stores codes or instructions that the processor 122 will execute. The RAM 123 stores data processed by the processor 122. The RAM 123 may include an SRAM.

The ECC block 124 performs an error correction operation. The ECC block 124 generates parity for error correction, based on first data DATA1 to be output to the memory interface 127 or second data DATA2 received from the host interface 125. The first data DATA1 and parity may be output through the memory interface 127. The ECC block 124 corrects an error of first data DATA1 using the first data DATA1 and parity that are received through the memory interface 127. The ECC block 124 may be implemented as a component of the memory interface 127.

The host interface 125 communicates with the external host device (refer to FIG. 1) according to a control of the processor 122. The host interface 125 receives the second command CMD2 and the second address ADDR2 from the external host device and exchanges the second data DATA2 with the external host device.

The host interface 125 may communicate using at least one of various communication manners, such as USB (Universal Serial Bus), SATA (Serial AT Attachment), HSIC (High Speed Interchip), SCSI (Small Computer System Interface), Firewire, PCI (Peripheral Component Interconnection), PCIe (PCI express), NVMe (NonVolatile Memory express), UFS (Universal Flash Storage), SD (Secure Digital), MMC (MultiMedia Card), and eMMC (embedded MMC).

The buffer control circuit 126 is configured to control a RAM 130 (refer to FIG. 1) according to a control of the processor 122. The buffer control circuit 126 writes data at the RAM 130 and reads data therefrom.

The memory interface 127 is configured to communicate with a nonvolatile memory 110 (refer to FIG. 1) according to a control of the processor 122. The memory interface 127 sends a first command CMD1 and a first address ADDR1 to the nonvolatile memory 110 and exchanges first data DATA1 and a control signal CTRL with the nonvolatile memory 110.

In exemplary embodiments, a storage device 100 may be configured not to include the RAM 130. That is, the storage device 100 does not have the RAM 130 outside of the memory controller 120 and the nonvolatile memory 110. In this case, the memory controller 120 does not include the buffer control circuit 126. A function of the RAM 130 is carried out using the RAM 123 of the memory controller 120.

In exemplary embodiments, the processor 122 controls the memory controller 120 using codes. The processor 122 may load codes from a nonvolatile memory (e.g., read only memory) that is implemented in the memory controller 120. Or, the processor 122 may load codes received from the memory interface 127.

In exemplary embodiments, the bus 121 of the memory controller 120 is divided into a control bus and a data bus. The data bus transfers data in the memory controller 120, and the control bus is configured to transfer control information in the memory controller 120: a command and an address. The data bus and the control bus are separated to prevent mutual interference or influence. The data bus is connected with the host interface 125, the buffer control circuit 126, the ECC block 124, and the memory interface 127. The control bus is connected with the host interface 125, the processor 122, the buffer control circuit 126, the RAM 123, and the memory interface 127.

Figure 10:
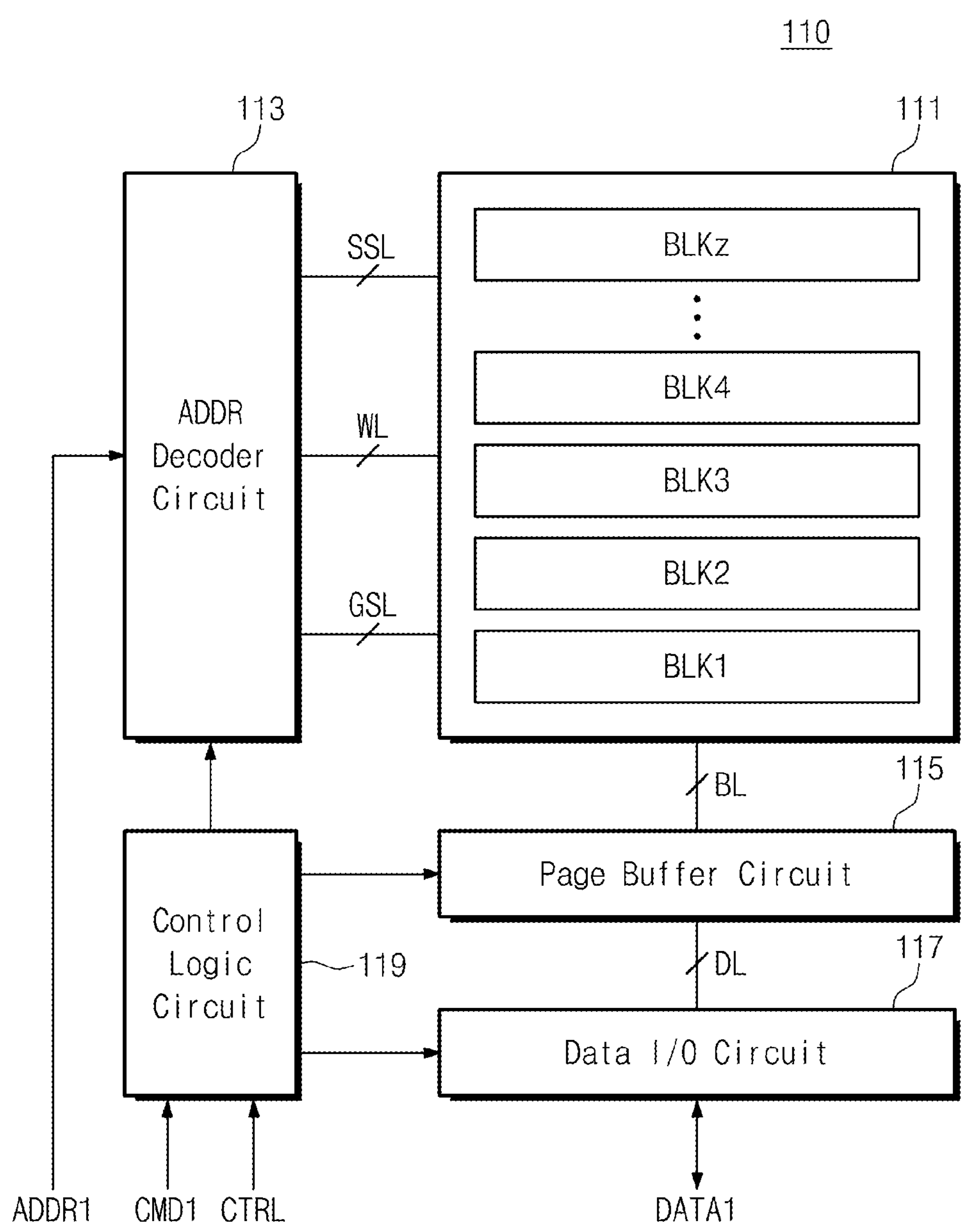
FIG. 10 is a block diagram schematically illustrating a nonvolatile memory according to an embodiment of the inventive concept.

FIG. 10 is a block diagram schematically illustrating a nonvolatile memory 110 according to an embodiment of the inventive concept. Referring to FIG. 10, a nonvolatile memory 110 includes a memory cell array 111, an address decoder circuit 113, a page buffer circuit 115, a data input/output circuit 117, and a control logic circuit 119.

The memory cell array 111 includes a plurality of memory blocks BLK1 through BLKz, each of which has a plurality of memory cells. Each memory block is connected to the address decoder circuit 113 through at least one string selection line SSL, a plurality of word lines WL, and at least one ground selection line GSL. Each memory block is connected to the page buffer circuit 115 through a plurality of bit lines BL. The memory blocks BLK1 through BLKz may be connected in common to the plurality of bit lines BL. Memory cells of the memory blocks BLK1 through BLKz may have the same structure. In exemplary embodiments, each of the memory blocks BLK1 through BLKz may be a unit of an erase operation. An erase operation may be carried out by the memory block. Memory cells of a memory block may be erased at the same time.

The address decoder circuit 113 is connected to the memory cell array 111 through a plurality of ground selection lines GSL, the plurality of word lines WL, and a plurality of string selection lines SSL. The address decoder circuit 113 operates in response to a control of the control logic circuit 119. The address decoder circuit 113 receives a first address ADDR1 from a memory controller 120. The address decoder circuit 113 decodes the first address ADDR1 and controls voltages to be applied to the word lines WL according to the decoded address.

For example, at programming, the address decoder circuit 113 applies a program voltage to a selected word line of a selected memory block that the first address ADDR1 points out. The address decoder circuit 113 also applies a pass voltage to unselected word lines of the selected memory block. At reading, the address decoder circuit 113 applies a selection read voltage to a selected word line of a selected memory block that the first address ADDR1 points out. The address decoder circuit 113 also applies a non-selection read voltage to unselected word lines of the selected memory block. At erasing, the address decoder circuit 113 applies an erase voltage (e.g., ground voltage) to word lines of a selected memory block that the first address ADDR1 points out.

The page buffer circuit 115 is connected to the memory cell array 111 through the bit lines BL. The page buffer circuit 115 is connected to the data input/output circuit 117 through a plurality of data lines DL. The page buffer circuit 115 operates in response to a control of the control logic circuit 119.

The page buffer circuit 115 holds data to be programmed at memory cells of the memory cell array 111 or data read from memory cells thereof. During a program operation, the page buffer circuit 115 stores data to be stored in memory cells. The page buffer circuit 115 biases the plurality of bit lines BL based on the stored data. The page buffer circuit 115 functions as a write driver at a program operation. During a read operation, the page buffer circuit 115 senses voltages of the bit lines BL and stores the sensed results. The page buffer circuit 115 functions as a sense amplifier at a read operation.

The data input/output circuit 117 is connected to the page buffer circuit 115 through the data lines DL. The data input/output circuit 117 exchanges first data DATA1 with the memory controller 120.

The data input/output circuit 117 temporarily stores first data DATA1 the memory controller 120 provides, and it transfers the temporarily stored data to the page buffer circuit 115. The data input/output circuit 117 temporarily stores data transferred from the page buffer circuit 115 and transfers it to the memory controller 120. The data input/output circuit 117 functions as a buffer memory.

The control logic circuit 119 receives a first command CMD1 and a control signal CTRL from the memory controller 120. The control logic circuit 119 decodes the first command CMD1 thus received and controls an overall operation of the nonvolatile memory 110 according to the decoded command. In exemplary embodiments, the control logic circuit 119 generates and outputs a data strobe signal DQS using a read enable signal /RE of the control signal CTRL at a read operation. At a write operation, the control logic circuit 119 produces and outputs the data strobe signal DQS using a data strobe signal DQS of the control signal CTRL.

Figure 11:
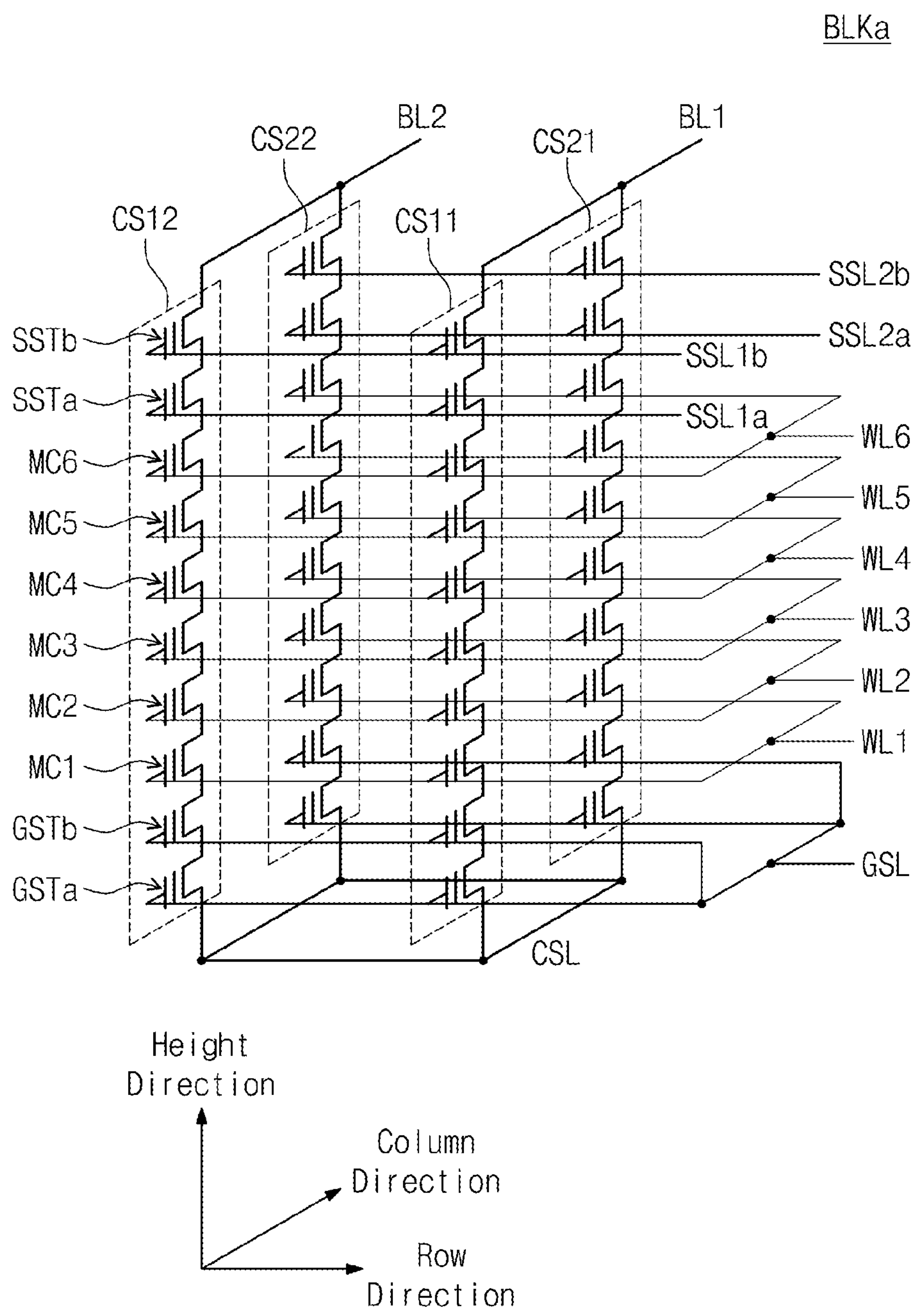
FIG. 11 is a circuit diagram schematically illustrating a memory block according to an embodiment of the inventive concept.

FIG. 11 is a circuit diagram schematically illustrating a memory block BLKa according to an embodiment of the inventive concept. Referring to FIG. 11, a memory block BLKa includes a plurality of cell strings CS11 through CS21 and CS12 through CS22. The plurality of cell strings CS11 through CS21 and CS12 through CS22 are arranged along a row direction and a column direction and form rows and columns.

For example, the cell strings CS11 and CS12 arranged along the row direction form a first row, and the cell strings CS21 and CS22 arranged along the row direction form a second row. The cell strings CS11 and CS21 arranged along the column direction form a first column, and the cell strings CS12 and CS22 arranged along the column direction form a second column.

Each cell string contains a plurality of cell transistors. The cell transistors include ground selection transistors GSTa and GSTb, memory cells MC1 through MC6, and string selection transistors SSTa and SSTb. The ground selection transistors GSTa and GSTb, memory cells MC1 through MC6, and string selection transistors SSTa and SSTb of each cell string are stacked in a height direction perpendicular to a plane (e.g., plane above a substrate of the memory block BLKa) on which the cell strings CS11 through CS21 and CS12 through CS22 are arranged along rows and columns.

Each cell transistor may be formed of a charge trap type cell transistor of which the threshold voltage varies with the amount of charge trapped in its insulation layer. Lowermost ground selection transistors GSTa are connected in common to a common source line CSL. The ground selection transistors GSTa and GSTb of the plurality of cell strings CS11 through CS21 and CS12 through CS22 are connected in common to a ground selection line GSL.

In exemplary embodiments, ground selection transistors with the same height (or, order) may be connected to the same ground selection line, and ground selection transistors with different heights (or, orders) may be connected to different ground selection lines. For example, the ground selection transistors GSTa with a first height are connected in common to a first ground selection line, and the ground selection transistors GSTb with a second height are connected in common to a second ground selection line.

In exemplary embodiments, ground selection transistors in the same row may be connected to the same ground selection line, and ground selection transistors in different rows may be connected to different ground selection lines. For example, the ground selection transistors GSTa and GSTb of the cell strings CS11 and CS12 in the first row are connected in common to the first ground selection line and the ground selection transistors GSTa and GSTb of the cell strings CS21 and CS22 in the second row are connected in common to the second ground selection line.

Connected in common to a word line are memory cells that are placed at the same height (or, order) from the substrate (or, the ground selection transistors GST). Connected to different word lines WL1 through WL6 are memory cells that are placed at different heights (or, orders). For example, the memory cells MC1 are connected in common to the word line WL1, the memory cells MC2 are connected in common to the word line WL2, and the memory cells MC3 are connected in common to the word line WL3. The memory cells MC4 are connected in common to the word line WL4, the memory cells MC5 are connected in common to the word line WL5, and the memory cells MC6 are connected in common to the word line WL6.

In first string selection transistors SSTa, having the same height (or, order), of the cell strings CS11 through CS21 and CS12 through CS22, the first string selection transistors SSTa in different rows are connected to different string selection lines SSL1*a* and SSL2*a*. For example, the first string selection transistors SSTa of the cell strings CS11 and CS12 are connected in common to the string selection line SSL1*a*, and the first string selection transistors SSTa of the cell strings CS21 and CS22 are connected in common to the string selection line SSL2*a*.

In second string selection transistors SSTb, having the same height (or, order), of the cell strings CS11 through CS21 and CS12 through CS22, the second string selection transistors SSTb in different rows are connected to the different string selection lines SSL1*a* and SSL2*a*. For example, the second string selection transistors SSTb of the cell strings CS11 and CS12 are connected in common to the string selection line SSL1*b*, and the second string selection transistors SSTb of the cell strings CS21 and CS22 are connected in common to the string selection line SSL2*b*.

That is, cell strings in different rows may be connected to different string selection lines. String selection transistors, having the same height (or, order), of cell strings in the same row may be connected to the same string selection line. String selection transistors, having different heights (or, orders), of cell strings in the same row may be connected to different string selection lines.

In exemplary embodiments, string selection transistors of cell strings in the same row may be connected in common to a string selection line. For example, string selection transistors SSTa and SSTb of cell strings CS11 and CS12 in the first row are connected in common to a string selection line, and string selection transistors SSTa and SSTb of cell strings CS21 and CS22 in the second row are connected in common to a string selection line.

Columns of the cell strings CS11 through CS21 and CS12 through CS22 are connected to different bit lines BL1 and BL2, respectively. For example, string selection transistors SSTb of the cell strings CS11 and CS21 in the first column are connected in common to the bit line BL1, and string selection transistors SSTb of the cell strings CS12 and CS22 in the second column are connected in common to the bit line BL2. The cell strings CS11 and CS12 form a first plane, and the cell strings CS21 and CS22 form a second plane.

A write and a read operation of the memory block BLKa may be performed by the row. For example, one plane is selected by the string selection lines SSL1*a*, SSL1*b*, SSL2*a*, and SSL2*b*. Connected to the bit lines BL1 and BL2 are cell strings CS11 and CS12 of the first plane when a turn-on voltage is applied to the string selection lines SSL1*a* and SSL1*b* and a turn-off voltage is supplied to the string selection lines SSL2*a* and SSL2*b*. That is, the first plane is selected. Connected to the bit lines BL1 and BL2 are cell strings CS21 and CS22 of the second plane when a turn-on voltage is applied to the string selection lines SSL2*a* and SSL2*b* and a turn-off voltage is supplied to the string selection lines SSL1*a* and SSL1*b*. That is, the second plane is selected. In a selected plane, a row of memory cells may be selected by word lines WL1 to WL6. A read or a write operation may be performed with respect to the selected row.

An erase operation on the memory block BLKa may be performed by the block or by the sub block. All of memory cells of a memory block BLKa may be erased when the erase operation is performed by the memory block. The erase operation being performed by the sub block, a part of memory cells of the memory block BLKa may be erased and the rest thereof may be erase-inhibited. A low voltage (e.g., ground voltage) is supplied to a word line connected to memory cells to be erased, and a word line connected to memory cells to be erase-inhibited is floated.

The memory block BLKa shown in FIG. 11 is exemplary. However, the inventive concept is not limited thereto. For example, the number of rows of cell strings may increase or decrease. If the number of rows of cell strings is changed, the number of string or ground selection lines and the number of cell strings connected to a bit line may also be changed.

The number of columns of cell strings may increase or decrease. If the number of columns of cell strings is changed, the number of bit lines connected to columns of cell strings and the number of cell strings connected to a string selection line may also be changed. A height of the cell strings may increase or decrease. For example, the number of ground selection transistors, memory cells, or string selection transistors that are stacked in each cell string may increase or decrease.

Figure 12:
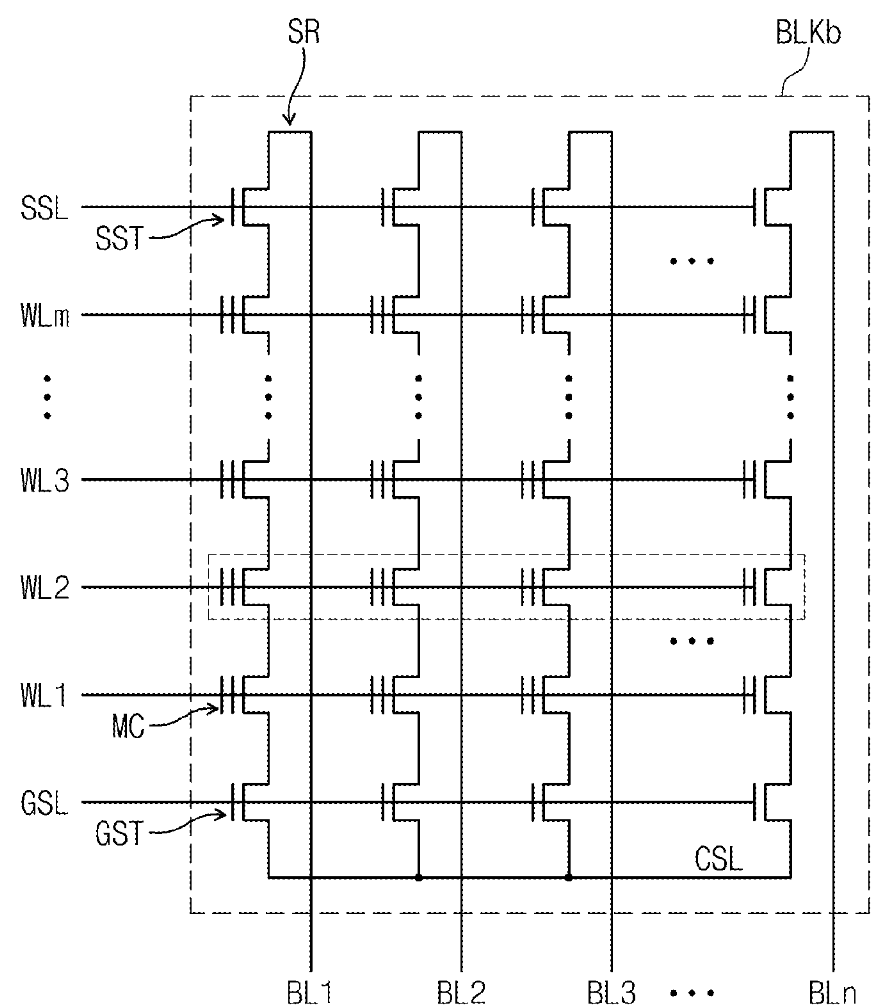
FIG. 12 is a circuit diagram schematically illustrating a memory block according to another embodiment of the inventive concept.

FIG. 12 is a circuit diagram schematically illustrating a memory block BLKb according to another embodiment of the inventive concept. Referring to FIG. 12, a memory block BLKb includes a plurality of strings SR, which are connected to a plurality of bit lines BL1 through BLn, respectively. Each string SR contains a ground selection transistor GST, memory cells MC, and a string selection transistor SST.

In each string SR, the ground selection transistor GST is connected between the memory cells MC and a common source line CSL. The ground selection transistors GST of the strings SR are connected in common to the common source line CSL. In each string SR, the string selection transistor SST is connected between the memory cells MC and a bit line BL. The string selection transistors SST of the strings SR are connected to a plurality of bit lines BL1 through BLn, respectively.

In each string SR, the plurality of memory cells MC are connected between the ground selection transistor GST and the string selection transistor SST. In each string SR, the plurality of memory cells MC are connected in series. In the strings SR, memory cells MC having the same height from the common source line CSL are connected in common to a word line. The memory cells MC of the strings SR are connected to a plurality of word lines WL1 through WLm.

In the memory block BLKb, an erase operation is performed by the memory block. When the erase operation is performed by the memory block, all memory cells of the memory block BLKb are simultaneously erased according to an erase request.

Figure 13:
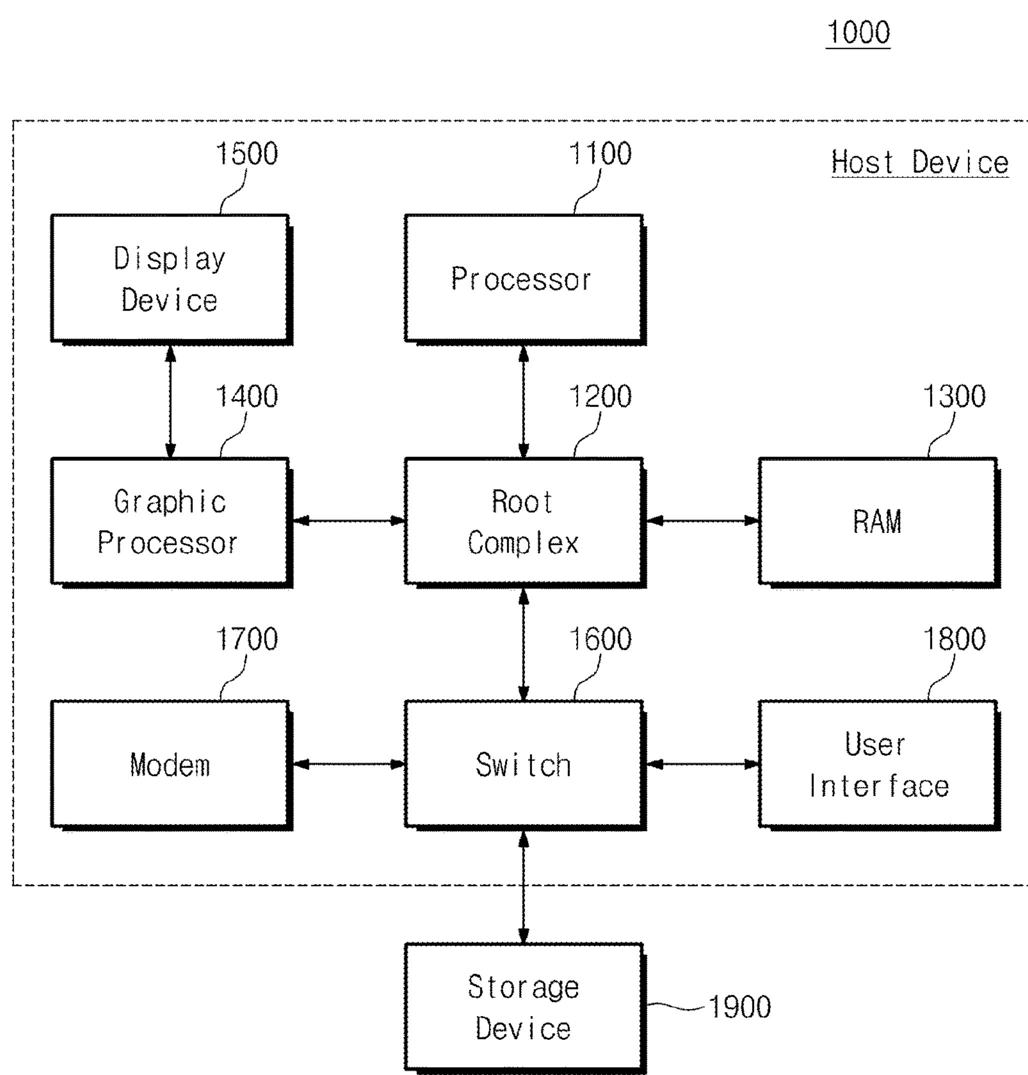
FIG. 13 is a block diagram schematically illustrating a computing device according to an embodiment of the inventive concept.

FIG. 13 is a block diagram schematically illustrating a computing device 1000 according to an embodiment of the inventive concept. Referring to FIG. 13, a computing device 1000 includes a processor 1100, a root complex 1200, a RAM 1300, a graphic processor 1400, a display device 1500, a switch 1600, a modem 1700, a user interface 1800, and a storage device 1900. The processor 1100, root complex 1200, RAM 1300, graphic processor 1400, display device 1500, switch 1600, modem 1700, and user interface 1800 constitute a host device that accesses the storage device 1900.

The processor 1100 controls an overall operation of the computing device 1000 and performs a logical operation. The processor 1100 may be formed of a system-on-chip (SoC). The processor 1100 may be a general purpose processor, a specific-purpose processor, or an application processor. The root complex 1200 connects the processor 1100 with other components of the computing device 1000. For example, the root complex 1200 may operate according to the specification of PCIe or NVMe.

The RAM 1300 is connected to the root complex 1200. The RAM 1300 may be a main memory of the processor 1100 or the computing device 1000. The processor 1100 temporarily stores codes or data in the RAM 1300. To process data, the processor 1100 executes codes using the RAM 1300. The processor 1100 executes a variety of software, such as, but not limited to, an operating system and an application, using the RAM 1300. The processor 1100 controls an overall operation of the computing device 1000 using the RAM 1300. The RAM 1300 may include a volatile memory such as, but not limited to, a static RAM, a dynamic RAM, or a synchronous DRAM or a nonvolatile memory such as, but not limited to, a Phase-change RAM (PRAM), a Magnetic RAM (MRAM), a Resistive RAM (RRAM), or a Ferroelectric RAM (FRAM).

The graphic processor 1400 is connected to the root complex 1200. The graphic processor 1400 processes image data. The graphic processor 1400 processes the image data and outputs an image through the display device 1500. The display device 1500 may include the following: a liquid crystal display (LCD) device, an organic light emitting diode (OLED) display device, and an active matrix OLED (AMOLED) display device.

The switch 1600 is connected to the root complex 1200. The switch 1600 interfaces communications between the switch 1600 and components connected to the root complex 1200. The switch 1600 may operate according to the specification of the PCIe or NVMe. The switch 1600 may be formed of one switch or combination of two or more switches.

The modem 1700 communicates with an external device according to a control of the processor 1100. For example, the modem 1700 communicates with the external device in a wire or wireless manner. The modem 1700 may communicate with the external device, based on at least one of wireless communications manners such as LTE (Long Term Evolution), WiMax, GSM (Global System for Mobile communication), CDMA (Code Division Multiple Access), Bluetooth, NFC (Near Field Communication), WiFi, and RFID (Radio Frequency Identification or wire communications manners such as USB (Universal Serial Bus), SATA (Serial AT Attachment), HSIC (High Speed Interchip), SCSI (Small Computer System Interface), Firewire, PCI (Peripheral Component Interconnection), PCIe (PCI express), NVMe (NonVolatile Memory express), UFS (Universal Flash Storage), SD (Secure Digital), SDIO, UART (Universal Asynchronous Receiver Transmitter), SPI (Serial Peripheral Interface), HS-SPI (High Speed SPI), RS232, I2C (Inter-integrated Circuit), HS-I2C, I2S, (Integrated-interchip Sound), S/PDIF (Sony/Philips Digital Interface), MMC (MultiMedia Card), and eMMC (embedded MMC).

The user interface 1800 communicates with a user according to a control of the processor 1100. For example, the user interface 1800 may include user input interfaces such as a keyboard, a keypad, a button, a touch panel, a touch screen, a touch pad, a touch ball, a camera, a microphone, a gyroscope sensor, and a vibration sensor. The user interface 1800 may further include user output interfaces such as an LCD, an OLED (Organic Light Emitting Diode) display device, an AMOLED (Active Matrix OLED) display device, an LED, a speaker, and a motor.

The storage device 1900 may communicate with the processor 1100. The storage device 1900 is used to store data for a long time. That is, the processor 1100 stores data, which is to be stored for a long time, in the storage device 1900. The storage device 1900 stores a boot image for driving the computing device 1000. The storage device 1900 stores source codes of a variety of software, such as an operating system and an application. The storage device 1900 stores data that is processed by a variety of software, such as an operating system and an application.

In exemplary embodiments, the processor 1100 loads source codes, stored in the storage device 1900, on the RAM 1300 and executes the codes loaded on the RAM 1300 to run a variety of software, such as an operating system and an application. The processor 1100 loads data, stored in the storage device 1900, on the RAM 1300 and processes the data loaded on the RAM 1300. Under a control of the processor 1100, data, to be retained for a long time, from among data stored in the RAM 1300 is stored in the storage device 1900.

The storage device 1900 may include nonvolatile memories, such as a flash memory, a Phase-change RAM (PRAM), a Magnetic RAM (MRAM), a Resistive RAM (RRAM), and a Ferroelectric RAM (FRAM). The storage device 1900 may include at least one of storage devices 100, 200, and 300 according to embodiments of the inventive concept.

Figure 14:
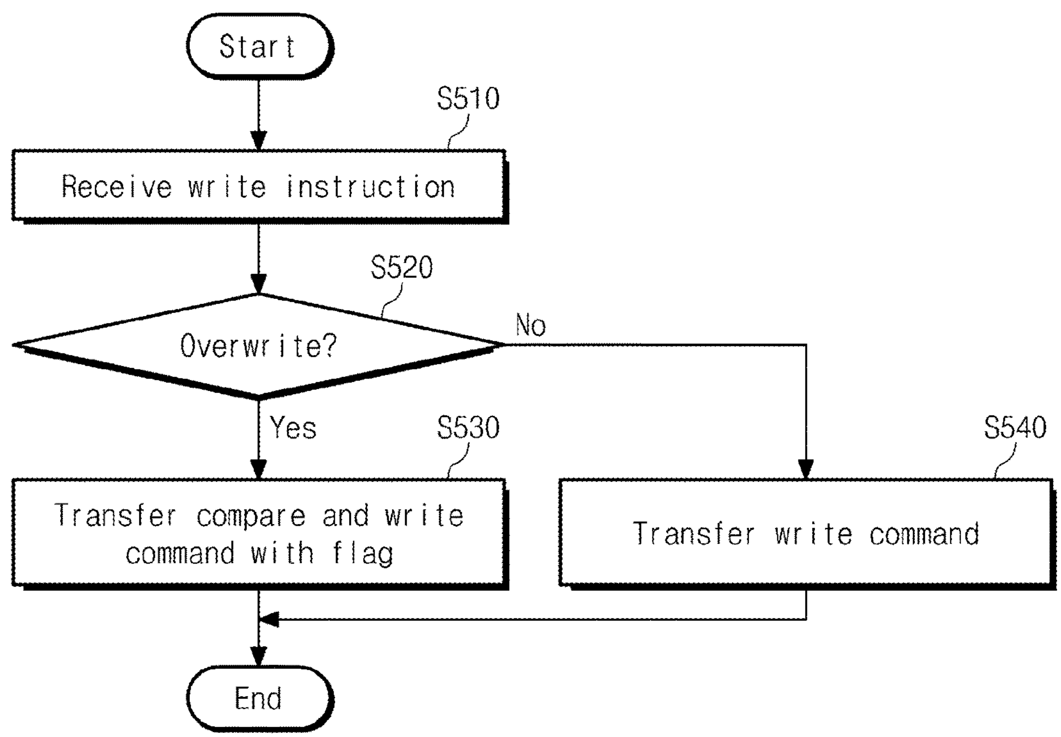
FIG. 14 is a flow chart showing an operating method of a computing device according to an embodiment of the inventive concept.

FIG. 14 is a flow chart showing an operating method of a computing device 1000 according to an embodiment of the inventive concept. Referring to FIGS. 13 and 14, in step S510, a write instruction is received. For example, the write instruction may be received from an application or an operating system driven on the computing device 1000. For example, received is a write instruction requesting writing of data, stored in a RAM 1300, at a storage device 1900. For example, when data loaded on the RAM 1300 from the storage device 1900 is released, a write instruction of data to be released may be received.

In step S520, whether write-requested data is overwrite data is determined. For example, when the write-requested data has been previously stored in the storage device 1900 or data loaded on the RAM 1300 from the storage device 1900, the write-requested data may be the overwrite data. If the write-requested data is newly generated data, not data previously stored in the storage device 1900, the write-requested data may not be the overwrite data.

As a consequence of determining that the write-requested data is the overwrite data, in step S530, the computing device 1000 provides the storage device 1900 with a command, requesting a compare and write operation described with reference to FIGS. 1 through 12, together with the write-requested data. As a consequence of determining that the write-requested data is not the overwrite data, in step S540, the computing device 1000 transmits the write-requested data to the storage device 1900 together with a write command.

Typically, the communication speed between a host device and a storage device may act as bottleneck of an operation where the host device accesses the storage device. Thus, a typical computing device is configured such that communication between the host device and the storage device is minimized. For example, the host device loads data on a RAM from the storage device and then accesses the loaded data. When data loaded on the RAM is written back at the storage device or is released, the host device detects updated data of the data loaded on the RAM and writes the detected data at the storage device. However, the above-described method necessitates additional data for determining whether data loaded on the RAM is updated and a time taken to process the additional data.

In recent years, operating speed between the host device and the storage device 1900 markedly increases due to the introduction of the high-speed interface standard such as NVMe. In this case, the communication speed between the host device and the storage device 1900 may not act as bottleneck of an operation where the host device accesses the storage device. If the communication speed between the host device and the storage device 1900 increases, a typical operating method for minimizing communications between the host device and the storage device 1900 causes unnecessary overhead.

With embodiments of the inventive concept, a host device does not need to separately manage whether data loaded on the RAM 1300 is updated. When writing of data loaded on the RAM 1300 is requested or when data loaded on the RAM 1300 is released, the host device transmits the whole data to the storage device 1900 together with second commands CMD2_1 and CMD2_2, regardless of whether data is updated. The storage device 1900 detects data, different from original data previously stored in the storage device 1900, from among the data transmitted from the host device. The storage device 1900 stores the detected data. With embodiments of the inventive concept, it is unnecessary for the host device to manage whether data is loaded on the RAM 1300, thereby resulting in a decrease in overhead of the computing device 1000 including the storage device 1900 and improving operating speed.

While the inventive concept has been described with reference to exemplary embodiments, it will be apparent to those skilled in the art that various changes and modifications may be made without departing from the spirit and scope of the present invention. Therefore, it should be understood that the above embodiments are not limiting, but illustrative.

What is claimed is:

1. A method of operating a storage device that includes a nonvolatile memory and a memory controller configured to control the nonvolatile memory, the method comprising:

receiving a first write command, an address, and first data at the memory controller;

writing the first data in the nonvolatile memory based on the address in response to the first write command;

receiving at the memory controller a second command, the address, and second data;

upon determining that the second command is a write command, writing the second data in the nonvolatile memory based on the address in response to the second command; and upon determining that the second command is a compare command including a first fused operation code, comparing, by the memory controller, the first data previously stored at a storage space of the nonvolatile memory corresponding to the address with the second data in response to the compare command;

receiving at the memory controller a second write command including a second fused operation code associated with the first fused operation code, the second write command being received along with the address and the second data;

upon determining that the first data previously stored are not equal to the second data in response to the first fused operation code, writing the second data in the nonvolatile memory based on the address in response to the second write command; and upon determining that the first data previously stored are equal to the second data in response to the first fused operation code, not writing the second data in response to the second write command.

2. The method of claim 1, wherein said comparing further comprises:

reading the first data previously stored from the nonvolatile memory; and comparing the read first data previously stored and the second data.

3. The method of claim 1, wherein said comparing further comprises:

producing first hash data from the second data;

reading the first data previously stored from the nonvolatile memory;

producing second hash data from the read first data previously stored; and comparing the first hash data and the second hash data.

4. The method of claim 1, wherein the storage device further comprises a random access memory configured to operate in response to control of the memory controller, wherein said comparing further comprises:

determining whether the first data previously stored is stored in the random access memory;

upon determining that the first data previously stored is stored in the random access memory, comparing the first data previously stored in the random access memory and the second data; and upon determining that the first data previously stored is not stored in the random access memory, reading the first data previously stored from the nonvolatile memory and comparing the read first data previously stored and the second data.

5. The method of claim 1, wherein the storage device further comprises a random access memory configured to operate in response to control of the memory controller, wherein said comparing further comprises:

producing first hash data of the second data;

determining whether second hash data of the first data previously stored is stored in the random access memory;

upon determining that the second hash data of the first data previously stored is stored in the random access memory, comparing the second hash data from the random access memory and the first hash data; and upon determining that the second hash data of the first data previously stored is not stored in the random access memory, reading the first data previously stored from the nonvolatile memory, producing the second hash data from the read first data previously stored, and comparing the first hash data and the second hash data produced from the read first data previously stored.

6. The method of claim 1, wherein the compare command further comprises a first flag code indicating a first specific operation.

7. The method of claim 6, wherein the second write command further comprises a second flag code indicating a second specific operation.

8. The method of claim 7, further comprising outputting a first response as a result of said comparing when the first data previously stored is different from the second data, and wherein the second write command is received after the first response is output.

9. The method of claim 7, wherein the compare command and the second write command are received regardless of operating steps of the storage device.

10. The method of claim 7, wherein the compare command and the second write command comprise a Non Volatile Memory express (NVMe) format.

11. The method of claim 1, wherein the storage device further comprises a random access memory configured to operate in response to control of the memory controller, and wherein said comparing comprises:

producing a first error check code of the second data;

determining whether a second error check code of the first data previously stored is stored in the random access memory;

upon determining that the second error check code of the first data previously stored is stored in the random access memory, comparing the second error check code stored in the random access memory with the first error check code; and upon determining that the second error check code of the first data previously stored is not stored in the random access memory, reading the second error check code from the nonvolatile memory and comparing the read second error check code and the first error check code.

12. A storage device comprising:

a nonvolatile memory; and a memory controller configured to control the nonvolatile memory, and configured to write in the nonvolatile memory first data received together with an address and a first write command from an external device in response to the first write command, wherein upon determining that a second command received from the external device along with the address and second data is a write command, the memory controller is further configured to write the second data in the nonvolatile memory based on the address in response to the second command, wherein upon determining that a second command is a compare command including a first fused operation code, the memory controller is further configured to compare the second data with the first data previously stored at a storage space of the nonvolatile memory corresponding to the address in response to the compare command, and wherein, after comparing the second data with the first data, the memory controller is further configured to receive a second write command including a second fused operation code related with the first fused operation code, determine whether the first data previously stored are equal to the second data in response to the first fused operation code, write the second data in the nonvolatile memory based on the address upon determining that the first data previously stored are not equal to the second data in response to the second write command, and not write the second data upon determining that the first data previously stored are equal to the second data in response to the second write command.

13. The storage device of claim 12, wherein the memory controller comprises a hash generator configured to produce a first hash from the second data and a second hash from the first data previously stored, and wherein the memory controller is further configured to compare the first hash of the second data and the second hash of the first data previously stored to provide a comparison result and determine whether the second data is the same as the first data previously stored based upon the comparison result.

14. The storage device of claim 12, wherein the memory controller comprises an Error Correction Code (ECC) block configured to produce a first error correction code from the second data, and wherein the memory controller is further configured to compare the first error correction code of the second data and a second error correction code of the first data previously stored to provide a comparison result and to determine whether the second data is the same as the first data previously stored based upon the comparison result.

15. A storage device comprising:

a nonvolatile memory; and a memory controller that controls the nonvolatile memory, the memory controller configured to receive a first write command, an address, and first data, write the first data in the nonvolatile memory based on the address in response to the first write command, receive a second command, the address and second data;

upon determining that the second command is a write command, write the second data in the nonvolatile memory based on the address in response to the second command, upon determining that the second command is a compare command including a first fused operation code, compare the first data previously stored at a storage space of the nonvolatile memory corresponding to the address with the second data in response to the compare command, receive a second write command including a second fused operation code associated with the first fused operation code, the second write command being received along with the address and the second data, upon determining that the first data previously stored are not equal to the second data in response to the first fused operation code, write the second data in the nonvolatile memory based on the address in response to the second write command, and upon determining that the first data previously stored are equal to the second data in response to the first fused operation code, not write the second data in response to the second write command.

16. The storage device of claim 15, wherein the memory controller is further configured to determine whether the first data previously stored at the storage space of the nonvolatile memory corresponding to the address is the same as the second data by reading the first data previously stored from the nonvolatile memory; and comparing the read first data previously stored with the second data.

17. The storage device of claim 15, wherein the memory controller is further configured to determine whether the first data previously stored at the storage space of the nonvolatile memory corresponding to the address is the same as the second data by producing first hash data from the second data;

reading the first data previously stored from the nonvolatile memory;

producing second hash data from the read first data previously stored; and comparing the first hash data and the second hash data.

18. The storage device of claim 15, wherein the compare command and the second write command received by the memory controller comprise a flag code indicating a specific operation.

19. The storage device of claim 15, wherein the memory controller is configured to determine whether the first data previously stored at the storage space of the nonvolatile memory corresponding to the address is the same as the second data by producing a first error check code from the second data, reading a second error check code of the first data previously stored from the nonvolatile memory, and comparing the read second error check code of the first data previously stored and the produced first error check code.

* * * * *